United States Patent
Baba et al.

(10) Patent No.: US 7,965,093 B2
(45) Date of Patent: Jun. 21, 2011

(54) TEST APPARATUS AND TEST METHOD FOR TESTING A DEVICE UNDER TEST USING A MULTI-STROBE

(75) Inventors: Tadahiko Baba, Saitama (JP); Hiroshi Kurosaki, Saitama (JP)

(73) Assignee: Advantest Corporation, Tokyo (JP)

( * ) Notice: Subject to any disclaimer, the term of this patent is extended or adjusted under 35 U.S.C. 154(b) by 177 days.

(21) Appl. No.: 12/370,609

(22) Filed: Feb. 13, 2009

(65) Prior Publication Data

US 2010/0207650 A1    Aug. 19, 2010

(51) Int. Cl.
*G01R 31/02* (2006.01)
*G01R 31/14* (2006.01)

(52) U.S. Cl. .................. 324/762.01; 324/762.02

(58) Field of Classification Search .............. None
See application file for complete search history.

(56) References Cited

U.S. PATENT DOCUMENTS

| | | | |
|---|---|---|---|
| 6,401,225 B1* | 6/2002 | Miura | 714/724 |
| 6,789,224 B2* | 9/2004 | Miura | 714/744 |
| 6,865,698 B2* | 3/2005 | Housako | 714/700 |
| 7,398,169 B2* | 7/2008 | Yamaguchi et al. | 702/69 |

FOREIGN PATENT DOCUMENTS

| WO | 2007/091413 | 8/2007 |
|---|---|---|
| WO | 2008136301 | 11/2008 |
| WO | 2009001451 | 12/2008 |

OTHER PUBLICATIONS

"Search Report of PCT Counterpart Application" issued on May 18, 2010, p. 1-p. 8.

* cited by examiner

*Primary Examiner* — Vinh P Nguyen
(74) *Attorney, Agent, or Firm* — Jianq Chyun IP Office

(57) ABSTRACT

Provided is a test apparatus for testing a device under test, including a multi-strobe generating section that generates, for each prescribed test cycle, a multi-strobe that includes a plurality of strobes arranged at prescribed time intervals, a data detecting section that detects a logic value of a response signal output by the device under test, according to each strobe, and a data width detecting section that detects a data width indicating a period during which the logic value of the response signal matches a prescribed expected value, based on each change point of a logic value output by the data detecting section.

20 Claims, 10 Drawing Sheets

|  | LEADING EDGE PHASE | TRAILING EDGE PHASE | DATA WIDTH | REFERENCE VALUE | | JUDGMENT |
| --- | --- | --- | --- | --- | --- | --- |
|  |  |  |  | min | max |  |
| PIN 1 | 5 | 11 | 6 | 5 | 10 | ○ |
| PIN 2 | 6 | 11 | 5 | 5 | 10 | ○ |
| PIN 3 | 4 | 10 | 6 | 5 | 10 | ○ |
| DEVICE UNDER TEST |  |  |  |  |  | ○ |

FIG. 6

|  | LEADING EDGE PHASE | TRAILING EDGE PHASE | DATA WIDTH | REFERENCE VALUE | | JUDGMENT |
| --- | --- | --- | --- | --- | --- | --- |
|  |  |  |  | min | max |  |
| PIN 1 | 5 | 11 | 6 | 5 | 10 | ○ |
| PIN 2 | 6 | 10 | 4 | 5 | 10 | × |
| PIN 3 | 4 | 9 | 5 | 5 | 10 | ○ |
| DEVICE UNDER TEST |  |  |  |  |  | × |

FIG. 7

|  | LEADING EDGE PHASE ||| TRAILING EDGE PHASE ||| REFERENCE VALUE || JUDGMENT |
|---|---|---|---|---|---|---|---|---|---|
|  | J1 | J2 | JITTER AMOUNT | J3 | J4 | JITTER AMOUNT |  |  |  |
| SELECTED EDGE |  | ○ |  |  |  |  | min | max |  |
| PIN 1 | 2 | 4 | 3 | 12 | 14 | 3 | 1 | 4 | ○ |
| PIN 2 | 1 | 4 | 4 | 11 | 13 | 3 | 1 | 4 | ○ |
| PIN 3 | 2 | 5 | 4 | 10 | 14 | 5 | 1 | 4 | ○ |
| DEVICE UNDER TEST |  |  |  |  |  |  |  |  | ○ |

FIG. 13

|  | LEADING EDGE PHASE ||| TRAILING EDGE PHASE ||| REFERENCE VALUE || JUDGMENT |
|---|---|---|---|---|---|---|---|---|---|
|  | J1 | J2 | JITTER AMOUNT | J3 | J4 | JITTER AMOUNT |  |  |  |
| SELECTED EDGE |  | ○ |  |  |  |  | min | max |  |
| PIN 1 | 2 | 4 | 3 | 12 | 14 | 3 | 1 | 4 | ○ |
| PIN 2 | 1 | 4 | 4 | 11 | 13 | 3 | 1 | 4 | ○ |
| PIN 3 | 2 | 5 | 4 | 10 | 14 | 5 | 1 | 4 | × |
| DEVICE UNDER TEST |  |  |  |  |  |  |  |  | × |

FIG. 14

TEST APPARATUS AND TEST METHOD FOR TESTING A DEVICE UNDER TEST USING A MULTI-STROBE

BACKGROUND

1. Technical Field

The present invention relates to test apparatus and a test method.

2. Related Art

A known semiconductor test apparatus measures the width (referred to hereinafter as "data width") of an eye aperture (referred to hereinafter as the "data window") of a response signal, which is output by a device under test in response to a test signal. This semiconductor test apparatus judges the acceptability of the device under test based on whether the data width is within a prescribed range.

The semiconductor test apparatus generates a strobe signal used to measure the data width, and detects leading edges and trailing edges of the response signal based on the strobe signal, as described in, for example, WO 2007/091413. The data width can be measured as the difference between a leading edge and a trailing edge of the response signal.

In conventional data width detecting methods, however, the leading edges and trailing edges of the response signal are detected in different test cycles, and therefore the data width of the response signal cannot be efficiently detected. This problem has become especially prominent recently due to an increase in the number of pins in a device under test.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus for testing a device under test, comprising a multi-strobe generating section that generates, for each prescribed test cycle, a multi-strobe that includes a plurality of strobes arranged at prescribed time intervals; a data detecting section that detects a logic value of a response signal output by the device under test, according to each strobe; and a data width detecting section that detects a data width indicating a period during which the logic value of the response signal matches a prescribed expected value, based on each change point of a logic value output by the data detecting section.

According to a second aspect related to the innovations herein, one exemplary test method may include a method for testing a device under test, comprising generating, for each prescribed test cycle, a multi-strobe that includes a plurality of strobes arranged at prescribed time intervals; detecting a logic value of a response signal output by the device under test, according to each strobe; and detecting a data width indicating a period during which the logic value of the response signal matches a prescribed expected value, based on each change point of the detected logic value.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 6 shows a method for judging acceptability of the device under test 200 based on the data width measurement results.

FIG. 7 shows a method for judging acceptability of the device under test 200 based on the data width measurement results.

FIG. 13 shows a method for judging that the device under test 200 is acceptable based on the jitter amount measurement result for each pin.

FIG. 14 shows a judgment method in a case where the edge selection signal indicates selection of a rising edge.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
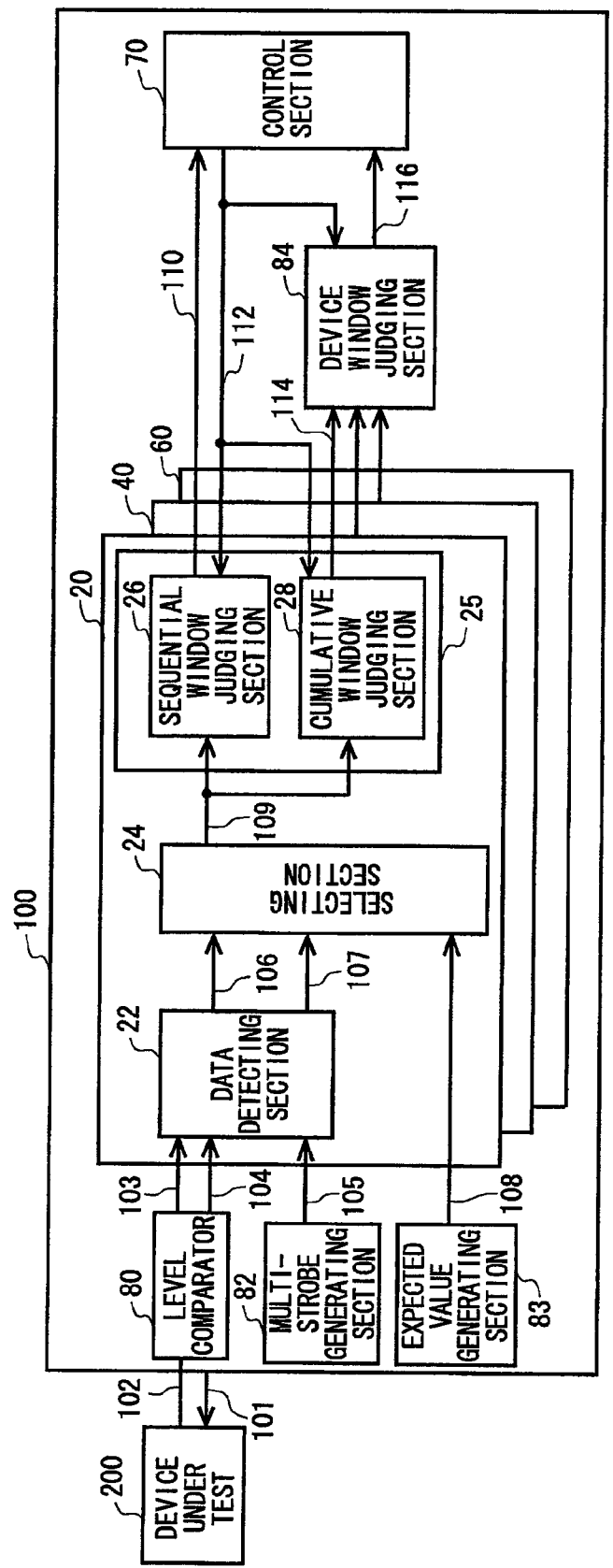
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 200 such as a semiconductor circuit. The test apparatus 100 may be connected to a plurality of pins of the device under test 200. The test apparatus 100 supplies a test signal 101 to the device under test 200. The device under test 200 outputs a response signal 102 in response to the test signal 101. The test signal 101 may be a signal having a prescribed logic pattern, a clock signal, or the like.

The test apparatus 100 includes a plurality of test function sections, e.g. the test function sections 20, 40, and 60 in the present embodiment, a control section 70, a level comparator 80, a multi-strobe generating section 82, an expected value generating section 83, and a device window judging section 84. The test function sections 20, 40, and 60 are each connected to a different output pin of the device under test 200. The test apparatus 100 may include a number of test function sections to correspond to the number of pins of the device under test 200.

The test function section 20 includes a data detecting section 22, a selecting section 24, and a data width detecting section 25. The data width detecting section 25 includes a sequential window judging section 26 and a cumulative window judging section 28. The test function section 40 and the test function section 60 may both have the same configuration as the test function section 20.

The level comparator 80 compares the signal level of the response signal 102 received from the device under test 200 to a prescribed threshold value. The level comparator 80 may compare the signal level of the response signal 102 to both a relatively high-voltage threshold value VH and a relatively low-voltage threshold value VL. The level comparator 80 may generate, for each threshold value, a logic data indicating the comparison result between the signal level of the response signal 102 and the threshold value, and output the generated logic data to the data detecting section 22.

For example, the level comparator 80 outputs a logic signal 103 that indicates "pass," e.g. a logic value of 0, when the signal level of the response signal 102 is greater than the threshold value VH and that indicates "fail," e.g. a logic value of 1, when the signal level of the response signal 102 is less than the threshold value VH. The level comparator 80 may also output a logic signal 104 that indicates "pass," e.g. a logic value of 0, when the signal level of the response signal 102 is less than the threshold value VL and that indicates "fail," e.g. a logic value of 1, when the signal level of the response signal 102 is greater than the threshold value VL.

The test apparatus 100 may include a plurality of level comparators 80 that correspond one-to-one with the pins of the device under test 200. Each level comparator 80 may output the logic signal 103 and the logic signal 104 to the data detecting section 22 of the corresponding test function section.

The multi-strobe generating section 82 generates, for each prescribed test cycle, a multi-strobe signal 105 that includes a plurality of strobe signals. For example, the multi-strobe generating section 82 may generate the multi-strobe signal 105 too include a plurality of strobe signals at uniform intervals.

The multi-strobe generating section 82 may generate each multi-strobe signal 105 such that the plurality of strobe signals are arranged over a period longer than a cycle of the response signal 102. For example, a period obtained by multiplying the interval between each strobe signal by the number of strobe signals in the multi-strobe signal 105 may be longer than one cycle of the response signal 102. By shortening the cycle of the response signal 102 of the device under test 200, the period covered by the multi-strobe signal can be made longer than the cycle of the response signal 102. More specifically, if the cycle of the response signal 102 is half of the test cycle, the multi-strobe generating section 82 may generate the multi-strobe signal 105 to span a period longer than half of the test cycle but shorter than the full test cycle.

If the cycle of the response signal 102 is shorter than a prescribed period, the multi-strobe generating section 82 may generate each multi-strobe signal 105 such that the strobe signals are arranged over a period longer than a cycle of the response signal 102. For example, in response to a change in the frequency of the response signal 102, the multi-strobe generating section 82 may switch whether the multi-strobe signal 105 includes strobe signals arranged over a period longer or shorter than the cycle of the response signal 102.

The expected value generating section 83 outputs, to the selecting section 24, an expected value 108 of the logic value of the response signal 102 received from the device under test 200. The expected value generating section 83 may output the expected value 108 based on the test signal 101.

The data detecting section 22 detects the logic value of the response signal 102 output by the device under test 200, according to each strobe signal. The data detecting section 22 may latch the logic signal 103 and the logic signal 104 with the multi-strobe signal 105 output by the multi-strobe generating section 82, to generate corresponding logic data 106 and logic data 107. The data detecting section 22 outputs the logic data 106 and the logic data 107 to the selecting section 24.

The selecting section 24 selects the logic data 106 or the logic data 107 based on the expected value 108 output by the expected value generating section 83. The selecting section 24 outputs the selected logic data to the data width detecting section 25 as selected data 109.

For example, if the expected value 108 has a value of 1, the selecting section 24 selects the logic data 106 corresponding to the high-voltage threshold value VH. If the expected value 108 has a value of 0, the selecting section 24 selects the logic data 107 corresponding to the low-voltage threshold value VL. Selected data 109 with a value of 0 indicates a "pass" state in which the logic value of the response signal 102 matches the expected value 108, and selected data 109 with a value of 1 indicates a "fail" state in which the logic value of the response signal 102 does not match the expected value 108.

The data width detecting section 25 detects the data width, which indicates the period over which the logic value of the response signal 102 matches the prescribed expected value 108, based on each change point of the logic value output by the data detecting section 22. The data width detecting section 25 may detect the data width, which indicates the period over which the logic value of the response signal 102 matches the prescribed expected value 108, over the period of a single multi-strobe signal 105, based on all of the change points detected using a single multi-strobe signal 105. The data width detecting section 25 may detect the data width based on each change point of the selected data 109 output by the selecting section 24.

When a first change point at which the logic value of the response signal 102 changes to the expected value 108 and a second change point at which the logic value of the response signal 102 changes from the expected value 108 are detected with a single multi-strobe signal 105, the data width detecting section 25 detects the data width based on the positions of the first change point and the second change point. For example, the data width detecting section 25 may detect the data width based on the positions of a first change point at which the value of the selected data 109 received from the selecting section 24 changes from 1 to 0 and a second change point at which this value changes from 0 to 1.

More specifically, when a second change point at which the logic value of the response signal 102 changes from the expected value 108 is detected after a first change point at which the logic value of the response signal 102 changes to the expected value 108, with a single multi-strobe signal 105, the data width detecting section 25 may detect the data width based on the positional difference between the first change point and the second change point. The data width detecting section 25 may calculate the data width by using a counter to detect the phase difference between the first change point and the second change point.

The sequential window judging section 26 outputs, to the control section 70, a sequential window judgment result 110 indicating whether the detected data width is within a prescribed allowable range, for each single multi-strobe signal 105. More specifically, the sequential window judging section 26 detects the data width of the response signal 102 based on the first change point at which the value of the selected data 109 received from the selecting section 24 changes from 1 to 0 and the second change point at which this value changes from 0 to 1. The sequential window judging section 26 may judge whether the data width of the response signal 102 is within an acceptable range, based on the data width reference value 112 output by the control section 70.

The cumulative window judging section 28 outputs a cumulative window judgment result 114 indicating whether a phase difference between (i) the first change point having the latest phase from among the first change points detected with a plurality of multi-strobe signals 105 and (ii) the second change point having the earliest phase from among the second change points detected with a plurality of multi-strobe signals 105 is within a prescribed allowable range. The cumulative window judging section 28 may accumulate the selected data 109 received from the selecting section 24 in association with each of a plurality of strobe signals having different phases and included in the plurality of multi-strobe signals 105. The cumulative window judging section 28 may detect (i) the phase of the change point having the latest phase from among the first change points and (ii) the phase of the change point having the earliest phase from among the second change points, based on the accumulated comparison results.

The cumulative window judging section 28 may accumulate the selected data 109 in a memory, with a different address for each multi-strobe signal 105 having a different phase. The cumulative window judging section 28 may judge whether the data width of the response signal 102 is within the allowable range based on the data width reference value 112 output by the control section 70.

The test apparatus 100 may test the plurality of pins of the device under test 200 in parallel. The device window judging section 84 may judge the acceptability of the device under test 200 based on the judgment result by the data width detecting section 25 in each test function section. More specifically, the device window judging section 84 acquires the cumulative window judgment result 114 corresponding to each pin from the cumulative window judging sections 28 in the test function sections 20, 40, and 60.

If the judgment result output by one of the test function sections 20, 40, and 60 is outside of the range of the data width reference value 112, the device window judging section 84 may judge the device under test 200 to be unacceptable. The device window judging section 84 may notify the control section 70 concerning the judgment result.

Figure 2:
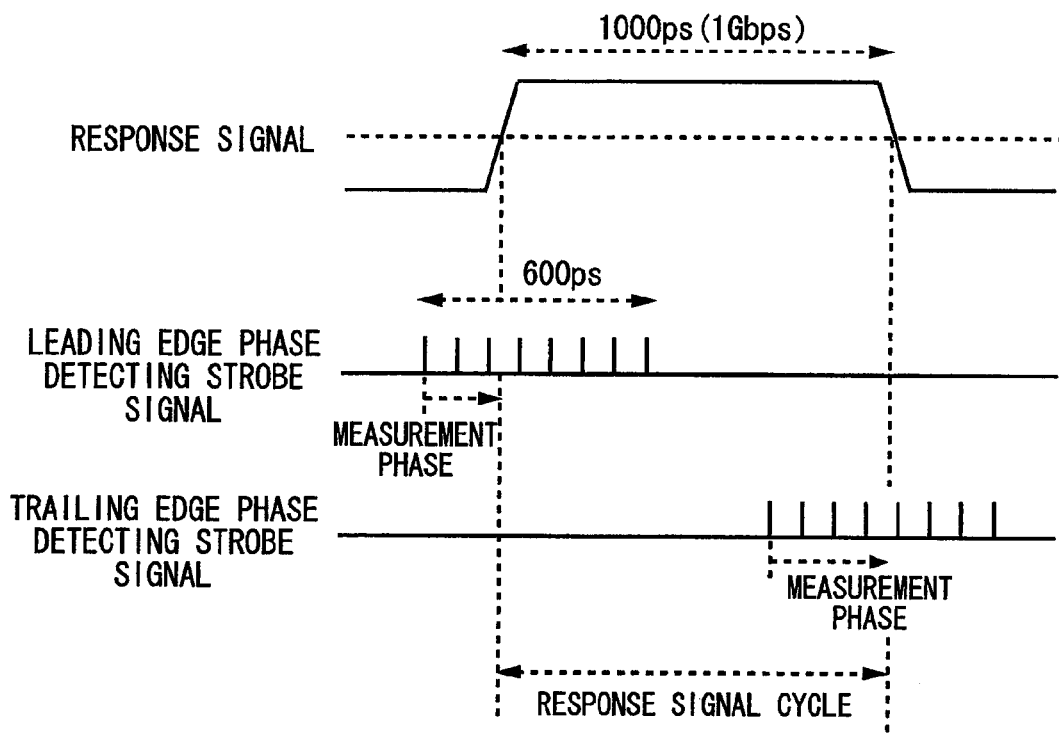
FIG. 2 shows a relationship between the response signal 102 and multi-strobe signals 105.

FIG. 2 shows an exemplary method, for detecting the data width of the response signal 102. The detection method of the present embodiment detects a rising change point, e.g. a leading edge, and a falling change point, e.g. a trailing edge, of the response signal 102 using a separate multi-strobe signal for each type of change point. In FIG. 2, the frequency of the response signal 102 is 1 Gbps and the data width of one cycle of the response signal 102 is 1000 ps. With these conditions, the multi-strobe generating section 82 outputs multi-strobe signals 105 that span a period of 600 ps around a region of the rising change point of the response signal 102 and the region of the falling change point of the response signal 102, respectively.

When detecting the rising change point of the response signal 102, the multi-strobe generating section 82 may begin outputting the multi-strobe signal 105 at a timing earlier than the timing at which the response signal 102 is expected to rise. When detecting the falling change point of the response signal 102, the multi-strobe generating section 82 may begin outputting the multi-strobe signal 105 at a timing earlier than the timing at which the response signal 102 is expected to fall.

Figure 3:
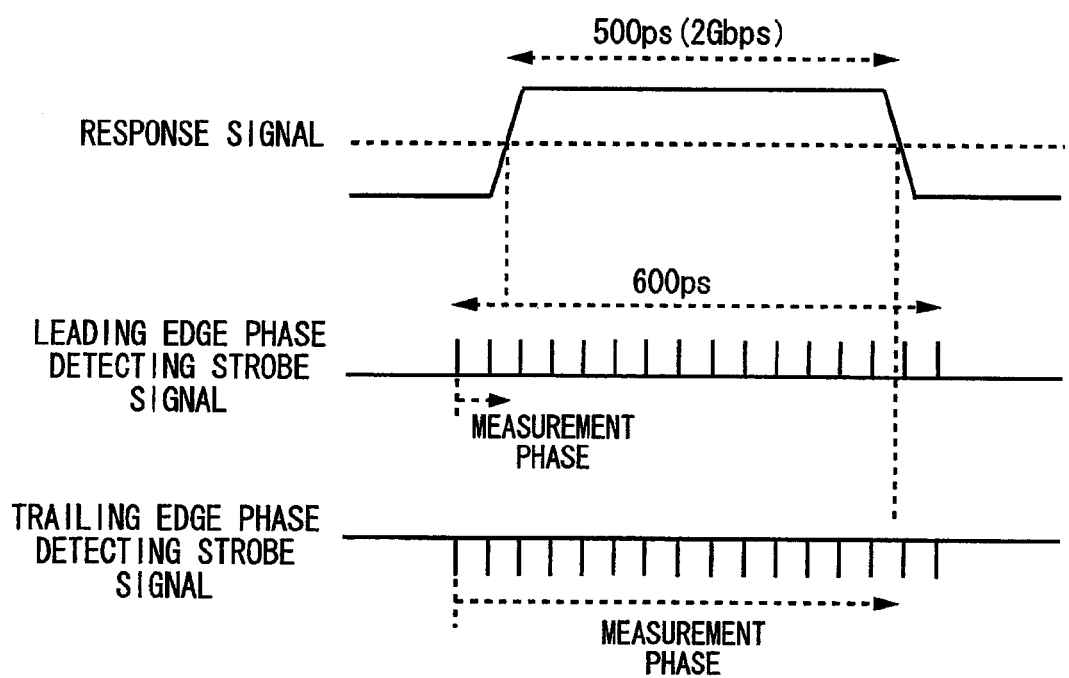
FIG. 3 shows a relationship between the response signal 102 and the multi-strobe signal 105 when the period of the multi-strobe signal 105 is longer than the data width.

FIG. 3 shows a relationship between the response signal 102 and multi-strobe signals 105 when the frequency of the response signal 102 is high and the output period of the multi-strobe signals 105 generated by the multi-strobe generating section 82 is longer than the data width. As in FIG. 2, when detecting the rising change point of the response signal 102, the multi-strobe generating section 82 outputs a multi-strobe signal 105 spanning 600 ps beginning just prior to the rising timing of the response signal 102. When detecting the falling change point of the response signal 102, the multi-strobe generating section 82 outputs a multi-strobe signal 105 spanning 600 ps beginning just prior to the falling timing of the response signal 102.

However, since the frequency of the response signal 102 in FIG. 3 is higher than the frequency of the response signal 102 in FIG. 2, the multi-strobe generating section 82 outputs the multi-strobe signal 105 to span a period longer than the data width of the response signal 102. As a result, both the rising change point and the falling change point of the response signal 102 are included within the period of a single multi-strobe signal 105. In this case, using a plurality of different multi-strobe signals 105 to detect the two change points, as described in relation to FIG. 2, results in the same measurement being performed twice, which decreases the efficiency of the test. Therefore, when two change points are included within the period of one multi-strobe signal 105, the test apparatus 100 desirably uses a single multi-strobe signal 105 to detect the two change points of the response signal 102.

Figure 4:
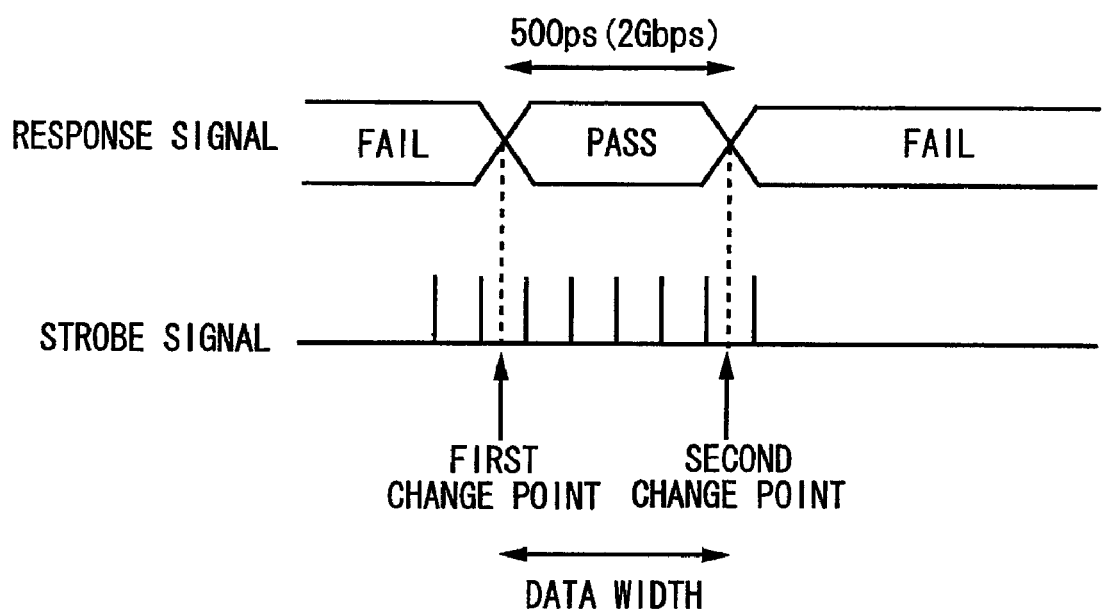
FIG. 4 shows the relationship between the response signal 102 and multi-strobe signals 105 when a single multi-strobe signal 105 is used to detect two change points in the response signal 102.

FIG. 4 shows the relationship between the response signal 102 and a multi-strobe signal 105 when a single multi-strobe signal 105 is used to detect two change points in the response signal 102. The multi-strobe generating section 82 begins outputting the multi-strobe signal 105 just prior to a first data change point of the response signal 102, and continues outputting the multi-strobe signal 105 until after a second data change point of the response signal 102. By using a single multi-strobe signal 105 to detect two change points of the response signal 102, the test apparatus 100 can decrease the amount of time necessary to measure the data width.

Figure 5:
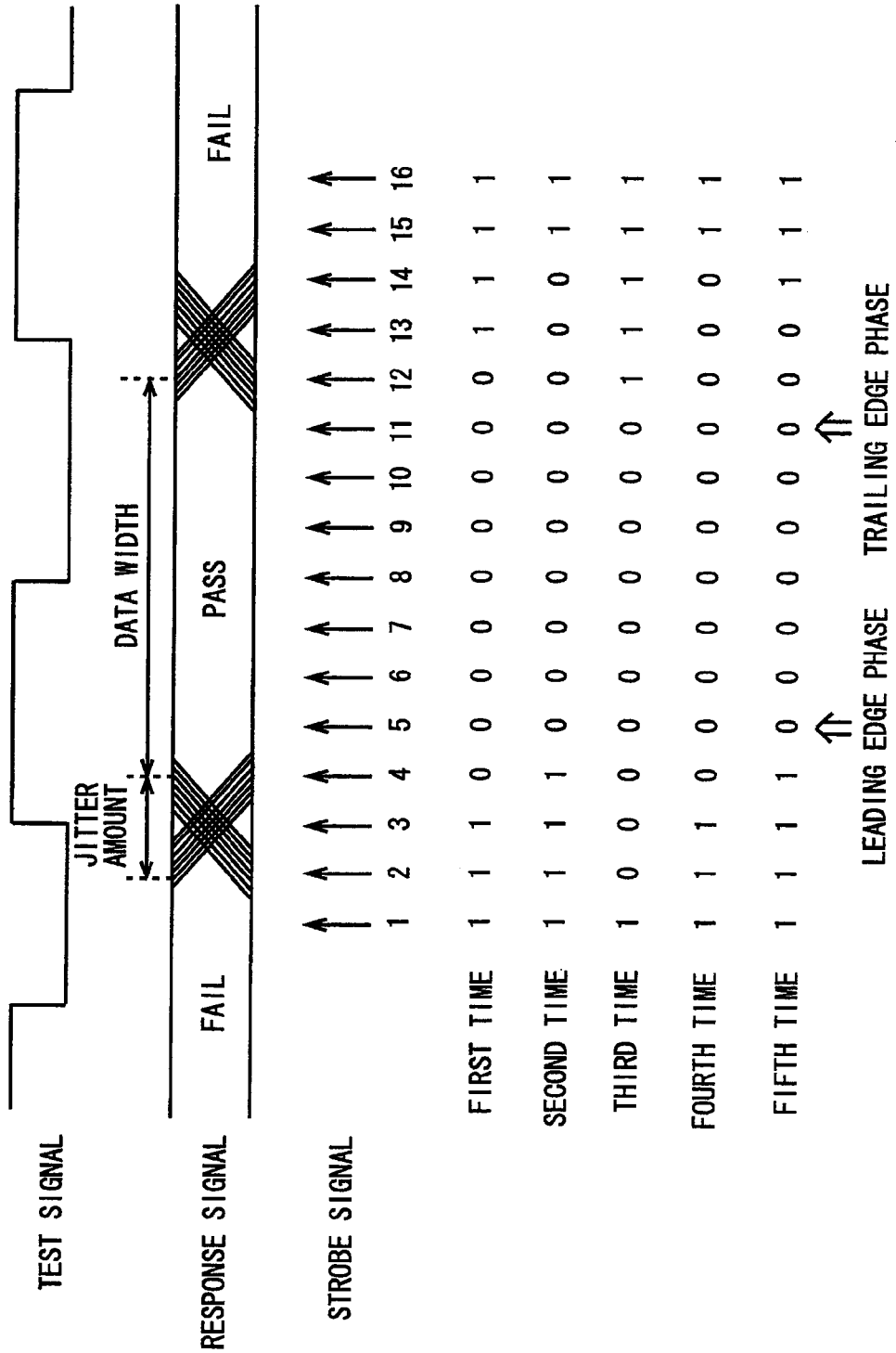
FIG. 5 shows a detailed description of the method for detecting the data width.

FIG. 5 shows a detailed description of the method for detecting the data width. The response signal 102 output by the device under test 200 has a value that changes in response to the test signal 101 output to the device under test 200 by the test apparatus 100. It should be noted that jitter occurs at the change points of the response signal 102 due to noise or the like. The test apparatus 100 may detect the data width of the data window during the period when there is no jitter, and then judge the acceptability of the device under test 200 based on the length of the data width.

In the present embodiment, the multi-strobe signal 105 used to measure the data width includes 16 strobe signals that each have different phases. The multi-strobe generating section 82 outputs a first-phase strobe signal at a timing just prior to the first change point of the response signal 102. The multi-strobe generating section 82 then sequentially generates a plurality of strobe signals that follow the first-phase strobe signal at constant intervals. The multi-strobe generating section 82 generates the sixteenth-phase strobe signal after the second timing at which the value of the response signal 102 changes.

The selecting section 24 selects either the logic data 106 or the logic data 107 based on the value of the expected value 108, and outputs the selected data 109 to the data width detecting section 25. When the output value of the level comparator 80 matches the expected value 108, the selected data 109 indicates "pass," e.g. a logic value of 0. When the output value of the level comparator 80 does not match the expected value 108, the selected data 109 indicates "fail," e.g. a logic value of 1.

In the first measurement in FIG. 5, for example, the logic value of the response signal 102 from the first phase to the third phase of the multi-strobe signal 105 does not match the expected value 108, and therefore the selecting section 24 outputs a value of 1. The logic value of the response signal 102 from the fourth phase to the twelfth phase of the multi-strobe signal 105 matches the expected value 108, and therefore the selecting section 24 outputs a value of 0. In the same way, the selecting section 24 outputs a value of 1 from the thirteenth phase to the sixteenth phase of the multi-strobe signal 105.

The sequential window judging section 26 acquires the selected data 109 output by the selecting section 24. The sequential window judging section 26 detects that the selected data 109 changes from a value of 1 to a value of 0 at the fourth phase and from a value of 0 to a value of 1 at the thirteenth phase. As a result, the sequential window judging section 26 detects the data width to have a length corresponding to nine times the strobe interval Ts, i.e. 9Ts.

The sequential window judging section 26 receives the data width reference value 112 from the control section 70. The sequential window judging section 26 judges the acceptability of the corresponding pin of the device under test 200 by comparing the value of the detected data width to the data width reference value 112. For example, when the data width reference value 112 indicates a value between 5Ts and 10Ts, non-inclusive, the length corresponding to 9Ts of the multi-strobe signal 105 fulfills the condition indicated by the data width reference value 112. Therefore, the sequential window judging section 26 judges that the corresponding pin of the device under test 200 is acceptable and outputs the judgment result to the control section 70.

The test apparatus 100 can increase the accuracy of the measurement by using a plurality of multi-strobe signals 105 to measure the response signal 102 multiple times. Since the timing at which the device under test 200 outputs the response signal 102 changes, the selected data 109 output by the selecting section 24 changes for each measurement. In the second measurement in FIG. 5, for example, the selecting section 24 outputs the selected data 109 with a value of 0 from the fifth phase to the fourteenth phase. In the third measurement, the selecting section 24 outputs a value of 0 from the second phase to the eleventh phase.

While each of the multi-strobe signals 105 are being generated, the cumulative window judging section 28 may store the selected data 109 output by the selecting section 24 in association with the phase of each strobe signal in the corresponding multi-strobe signal 105. Furthermore, the cumulative window judging section 28 may detect the leading edge phase and the trailing edge phase of the data window based on the selected data 109 output by the selecting section 24.

When measuring the leading edge phase of the data window, the cumulative window judging section 28 selects the latest phase at which the selected data 109 output by the selecting section 24 changes from a value of 1 to a value of 0, from among the phases obtained from the multiple measurements. For example, in the second and fifth measurements in FIG. 5, the fifth phase is the latest phase at which the value of the selected data 109 changes from 1 to 0. Therefore, the cumulative window judging section 28 detects that the leading edge phase is the fifth phase.

In the same way, when measuring the trailing edge phase of the data window, the cumulative window judging section 28 selects the earliest phase at which the selected data 109 output by the selecting section 24 changes from a value of 0 to a value of 1, from among the phases obtained from the multiple measurements. For example, in the third measurement in FIG. 5, the twelfth phase is the earliest phase at which the value of the selected data 109 changes from 0 to 1. Therefore, the cumulative window judging section 28 detects the trailing edge phase to be the eleventh phase, which is the phase immediately before the phase at which the value of the selected data 109 changes from 0 to 1.

The cumulative window judging section 28 detects the data width based on the values of the detected leading edge phase and trailing edge phase. The cumulative window judging section 28 may judge the acceptability of the corresponding pin by comparing the detected data width to the data width reference value 112.

The cumulative window judging section 28 outputs the acceptability judgment result of the pin to the device window judging section 84. The device window judging section 84 receives judgment results concerning the pins of the device under test 200 corresponding to the test function section 20, the test function section 40, and the test function section 60, respectively. The device window judging section 84 judges the acceptability of the device under test 200 based on the received judgment results.

FIG. 6 shows a method for judging acceptability of the device under test 200 based on the data width measurement results. The data window of the response signal 102 output by pin 1 has a leading edge at the fifth phase and a trailing edge at the eleventh phase. The data window of the response signal 102 output by pin 2 has a leading edge at the sixth phase and a trailing edge at the eleventh phase. The data window of the response signal 102 output by pin 3 has a leading edge at the fourth phase and a trailing edge at the tenth phase.

The data width corresponding to the phase difference between the leading edge phase and the trailing edge phase for pins 1 to 3 is 6Ts, 5Ts, and 6Ts, respectively, all of which are within the range of 5Ts to 10Ts indicated by the data width reference value 112. Since the data width measurement values for all of the pins are within the reference range, the device window judging section 84 judges the device under test 200 to be acceptable.

FIG. 7 shows a method for judging acceptability of the device under test 200 based on the data width measurement results. In FIG. 7, the data window of the response signal 102 output by pin 2 has a leading edge at the sixth phase and a trailing edge at the tenth phase. Accordingly, pin 2 has a data width of 4Ts, which is outside of the reference range. Therefore, the device window judging section 84 judges the device under test 200 to be unacceptable. The device window judging section 84 may output the judgment result 116 to the control section 70.

In the above description, the cumulative window judging section 28 judges the acceptability of each pin of the device under test 200 and then outputs the cumulative window judgment result 114 to the device window judging section 84, but the cumulative window judging section 28 may instead output the detected data width to the device window judging section 84. In this case, the device window judging section 84 may judge the acceptability of the device under test 200 based on (i) the value of the data width output by the cumulative window judging section 28 in each test function section and (ii) the data width reference value 112 output by the control section 70.

As described above, the test apparatus 100 can accurately detect the data width of the response signal 102 by accumulating the selected data 109 in association with the phases of the plurality of strobe signals included in each of the plurality of multi-strobe signals 105. Furthermore, the test apparatus 100 can judge the acceptability of the device under test 200 in a short time by testing the pins of the device under test 200 in parallel.

Figure 8:
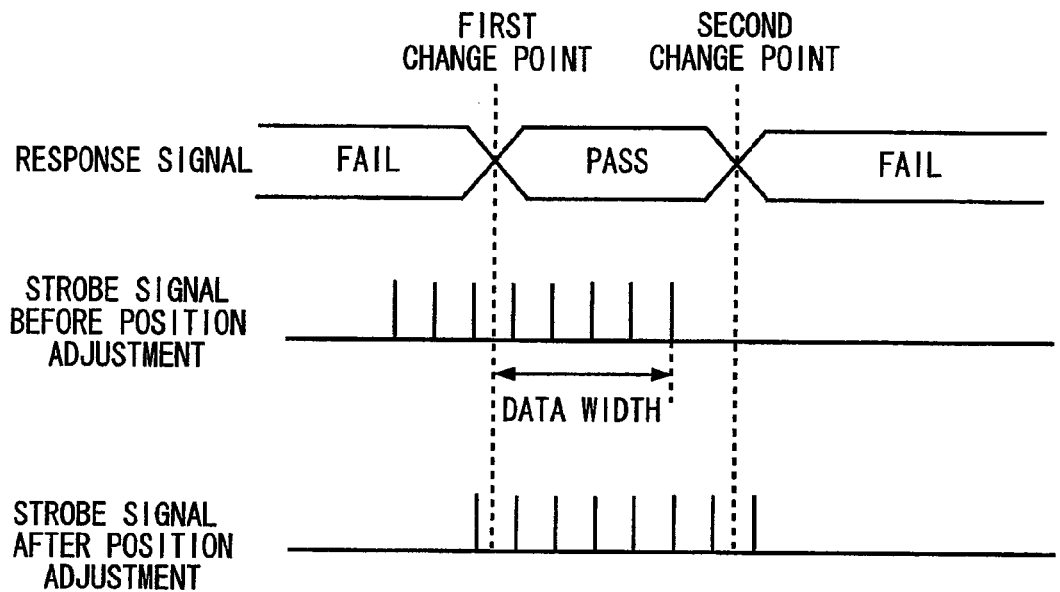
FIG. 8 shows a relationship between the response signal 102 and a multi-strobe signal 105, according to another embodiment.

FIG. 8 shows a relationship between the response signal 102 and a multi-strobe signal 105, according to another embodiment. In FIG. 8, the period during which the multi-strobe generating section 82 generates the multi-strobe signal 105 does not include a second change point where the logic value of the response signal 102 changes from the expected value 108. If a second change point at which the logic value of the response signal 102 changes from the expected value 108 is not detected after a first change point at which the logic value of the response signal 102 changes to the expected value 108 is detected in a single multi-strobe signal 105, the multi-strobe generating section 82 may adjust the phase of the multi-strobe signal 105 until a second change point at which the logic value of the response signal 102 changes from the expected value 108 is detected after a first change point at which the logic value of the response signal 102 changes to the expected value 108 is detected. For example, the multi-strobe generating section 82 may adjust the phase of the multi-strobe signal 105 to have a position shown by the strobe signal after position adjustment shown in FIG. 8.

If a second change point at which the logic value of the response signal 102 changes from the expected value 108 is not detected after a first change point at which the logic value of the response signal 102 changes to the expected value 108 is detected, with a single multi-strobe signal 105, the data width detecting section 25 may detect the data width based on the period from the first change point to the end point of the multi-strobe signal 105. For example, if the multi-strobe signal 105 is at the position of the strobe signal before position adjustment shown in FIG. 8, the data width detecting section 25 may detect the data width to be the period between the first change point and the strobe signal having the latest phase in the strobe signal before position adjustment.

If a second change point at which the logic value of the response signal 102 changes from the expected value 108 is not detected after a first change point at which the logic value of the response signal 102 changes to the expected value 108 is detected, with a single multi-strobe signal 105, the multi-strobe generating section 82 may delay the phase of the multi-strobe signal 105 on a condition that the data width detected by the data width detecting section 25 is outside of the prescribed allowable range. For example, if the multi-strobe signal 105 is at the position of the strobe signal before position adjustment shown in FIG. 8 and the data width detected by the data width detecting section 25 is not within the range of the data width reference value 112, the multi-strobe generating section 82 may delay the phase of the multi-strobe signal 105 such that the multi-strobe signal 105 is at the position of the strobe signal after position adjustment.

When the data width detected by the data width detecting section 25 is not within the range of the data width reference value 112, the multi-strobe generating section 82 may change the phase of the multi-strobe signal 105. The multi-strobe generating section 82 may determine whether to change the phase of the multi-strobe signal 105 based on the judgment result from the sequential window judging section 26. Instead, the multi-strobe generating section 82 may determine whether to change the phase of the multi-strobe signal 105 under control of the control section 70.

Figure 9:
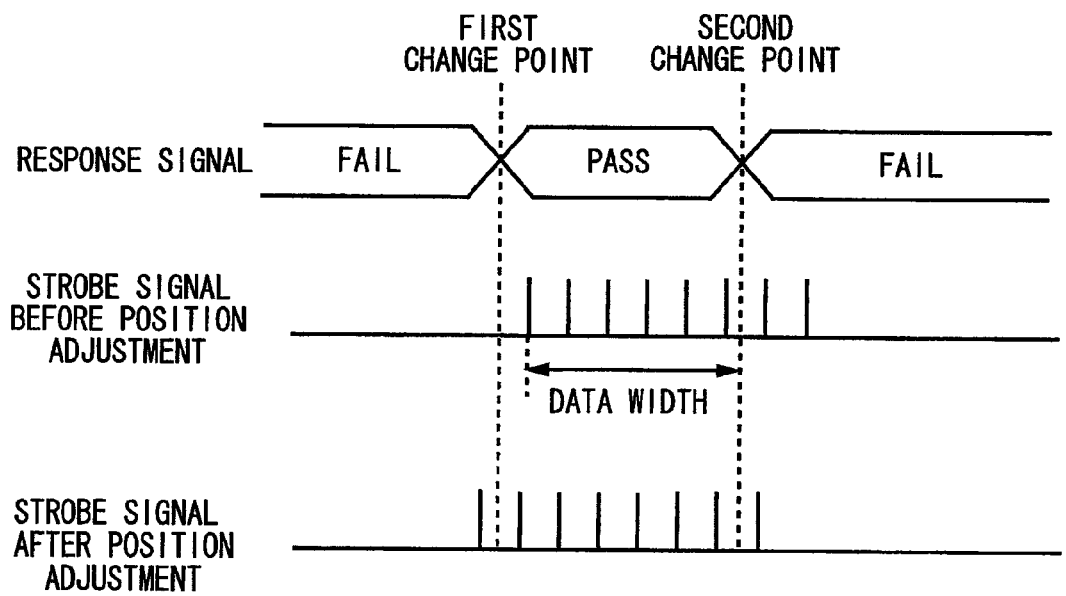
FIG. 9 shows a relationship between the response signal 102 and a multi-strobe signal 105, according to another embodiment.

FIG. 9 shows a relationship between the response signal 102 and a multi-strobe signal 105, according to another embodiment. If a first change point at which the logic value of the response signal 102 changes to the expected value 108 is not detected before a second change point at which the logic value of the response signal 102 changes from the expected value 108 is detected, with a single multi-strobe signal 105, the data width detecting section 25 may detect the data width to be the period from the start point of the multi-strobe signal 105 to the second change point. For example, if the multi-strobe signal 105 is at the position of the strobe signal before position adjustment shown in FIG. 9, the data width detecting section 25 may detect the data width to be the period between (i) the strobe signal having the earliest phase in the strobe signal before position adjustment and (ii) the second change point.

If a first change point at which the logic value of the response signal 102 changes to the expected value 108 is not detected before a second change point at which the logic value of the response signal 102 changes from the expected value 108 is detected, with a single multi-strobe signal 105, the multi-strobe generating section 82 may cause the phase of the multi-strobe signal 105 to be earlier on a condition that the data width detected by the data width detecting section 25 is outside of the prescribed allowable range. For example, if the multi-strobe signal 105 is at the position of the strobe signal before position adjustment shown in FIG. 9 and the data width detected by the data width detecting section 25 is not within the range of the data width reference value 112, the multi-strobe generating section 82 may cause the phase of the multi-strobe signal 105 to be earlier such that the multi-strobe signal 105 is at the position of the strobe signal after position adjustment. If the data width detected by the data width detecting section 25 is within the range of the data width reference value 112, the multi-strobe generating section 82 need not change the phase of the multi-strobe signal 105.

Figure 10:
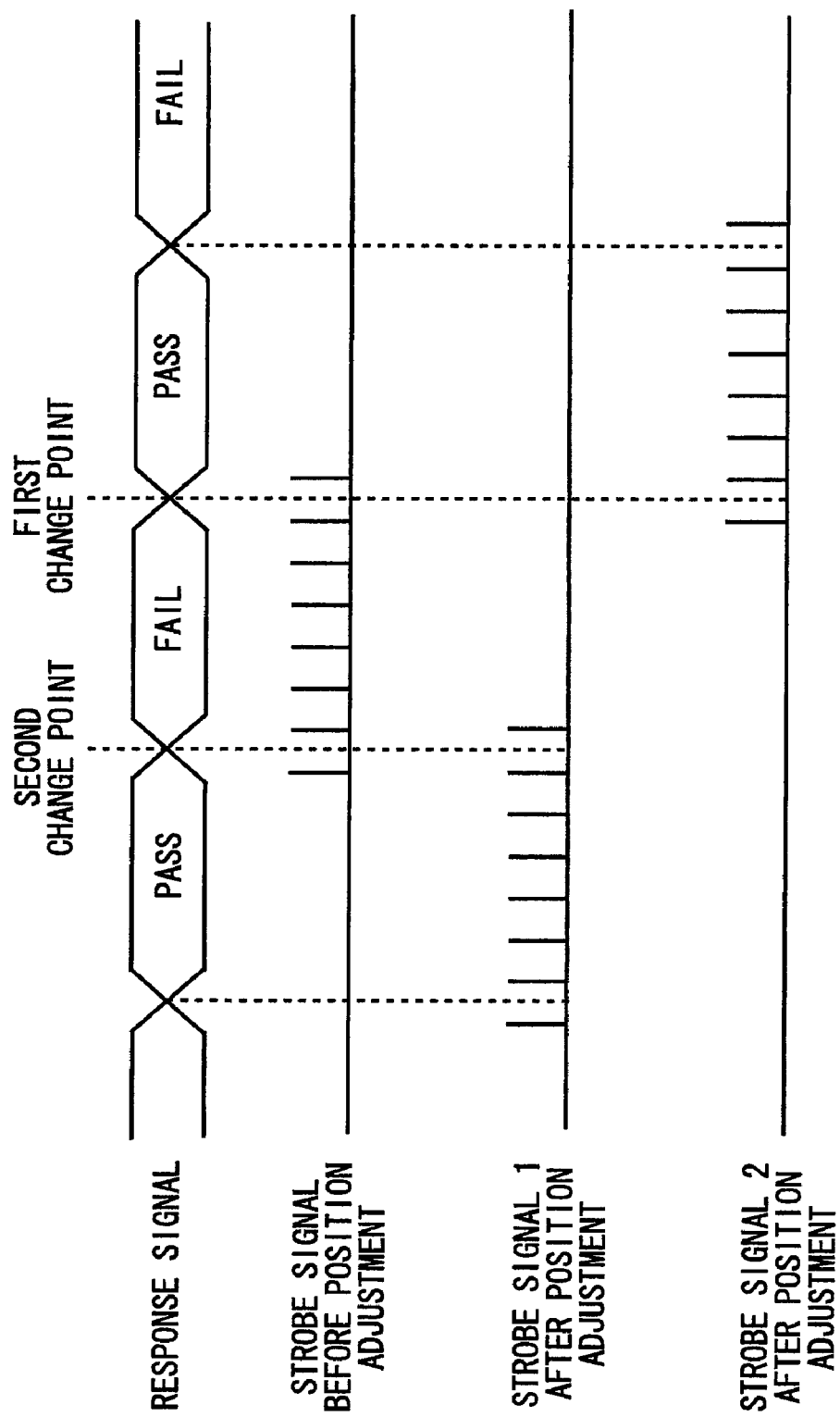
FIG. 10 shows the relationship between the response signal 102 and a multi-strobe signal 105 according to another embodiment.

FIG. 10 shows the relationship between the response signal 102 and a multi-strobe signal 105 according to another embodiment. The present embodiment describes a situation where the multi-strobe generating section detects a first change point at which the logic value of the response signal 102 changes to the expected value 108 after detecting a second change point at which the logic value of the response signal 102 changes from the expected value 108, with a single multi-strobe signal 105. In this case, the multi-strobe generating section 82 may change the phase of the multi-strobe signal 105 until the data width detected by the data width detecting section 25 is within the prescribed allowable range. The multi-strobe generating section 82 may cause the phase of the multi-strobe signal 105 to be earlier such that the multi-strobe signal 105 is at the position of the strobe signal 1 after position adjustment shown in FIG. 10, or may delay the phase of the multi-strobe signal 105 such that the multi-strobe signal 105 is at the position of the strobe signal 2 after position adjustment shown in FIG. 10.

Figure 11:
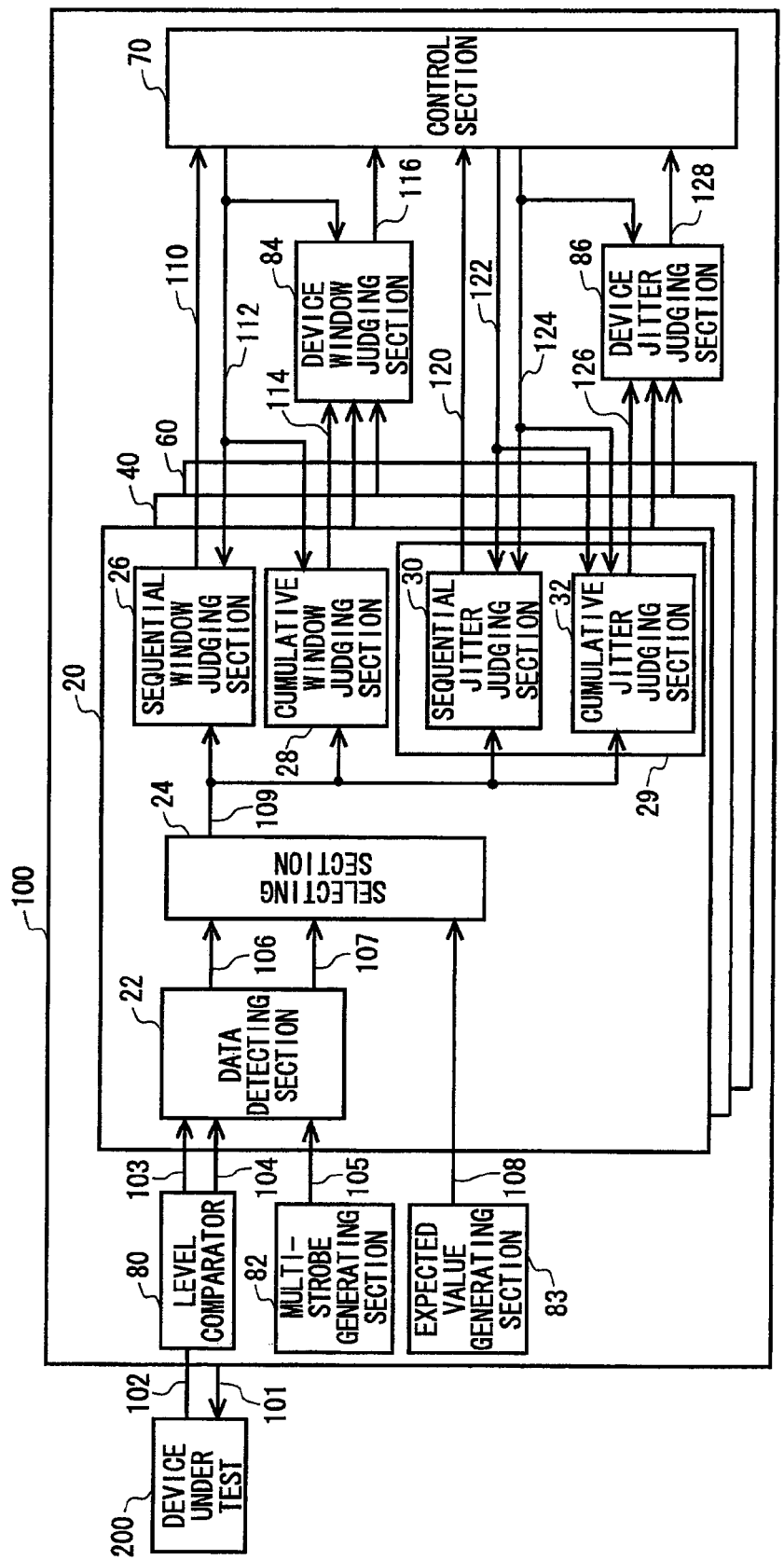
FIG. 11 shows a configuration of the test apparatus 100 according to another embodiment.

FIG. 11 shows a configuration of the test apparatus 100 according to another embodiment. The test apparatus 100 of the present embodiment is further provided with a device jitter judging section 86. The test function section 20 further includes a jitter detecting section 29. The jitter detecting section 29 detects the jitter of the first change point or the second change point for each multi-strobe signal.

The jitter detecting section 29 includes a sequential jitter judging section 30 that outputs a sequential jitter judgment result indicating whether the detected jitter is within an allowable range, for each multi-strobe signal 105. The jitter detecting section 29 also includes a cumulative jitter judging section 32 that outputs a cumulative jitter judgment result 120 indicating whether a phase difference between the latest phase and the earliest phase, from among the phases of the change points detected with a plurality of multi-strobe signals 105, is within the prescribed allowable range. The control section 70 outputs, to the sequential jitter judging section 30 and the cumulative jitter judging section 32, a jitter amount reference value 122 and an edge selection signal 124 that selects a polarity of the change point of the selected data 109 for which jitter is to be measured.

The test apparatus 100 may test the plurality of pins of the device under test 200 in parallel. A jitter detecting section 29 is provided for each pin of the device under test 200, and the test apparatus 100 may include a device jitter judging section 86 that judges the acceptability of the device under test 200 based on the judgment results from the plurality of jitter detecting sections 29. In other words, in the same manner as the test function section 20, the test function section 40 and the test function section 60 may each include a jitter detecting section 29, and the device jitter judging section 86 may judge the acceptability of the device under test 200 based on the judgment results output by the test function sections 20, 40, and 60.

The sequential jitter judging section 30 acquires the selected data 109 obtained as a result of the multiple measurements by the selecting section 24. The sequential jitter judging section 30 detects a phase range of the multi-strobe signal 105 in which jitter occurs, based on the selected data 109. When the edge selection signal 124 has a value of 1, the sequential jitter judging section 30 may measure the amount of jitter at a timing at which the value of the selected data 109 changes from 1 to 0. When the edge selection signal 124 has a value of 0, the sequential jitter judging section 30 may measure the amount of jitter at a timing at which the value of the selected data 109 changes from 0 to 1.

When the measured jitter amount is within the range indicated by the jitter amount reference value 122, the sequential jitter judging section 30 outputs a cumulative jitter judgment result 120 indicating that the measured pin is acceptable to the control section 70. On the other hand, when the measured jitter amount is outside the range indicated by the jitter amount reference value 122, the sequential jitter judging section 30 outputs a cumulative jitter judgment result 120 indicating that the measured pin is unacceptable to the control section 70.

The cumulative jitter judging section 32 accumulates the selected data 109 obtained by the selecting section 24 over multiple measurements, in association with the phase of each strobe signal in the multi-strobe signal 105. The cumulative jitter judging section 32 detects the jitter amount based on the accumulated selected data 109. The cumulative jitter judging section 32 may judge the acceptability of the jitter amount of the corresponding pin based on the jitter amount reference value 122 output by the control section 70.

The device jitter judging section 86 acquires a cumulative jitter judgment result 126 for each pin output by the corresponding test function sections 20, 40 and 60. The device jitter judging section 86 judges the acceptability of the device under test 200 based on the cumulative jitter judgment result 126 acquired for each pin. The device jitter judging section 86 may notify the control section 70 concerning the judgment result.

Figure 12:
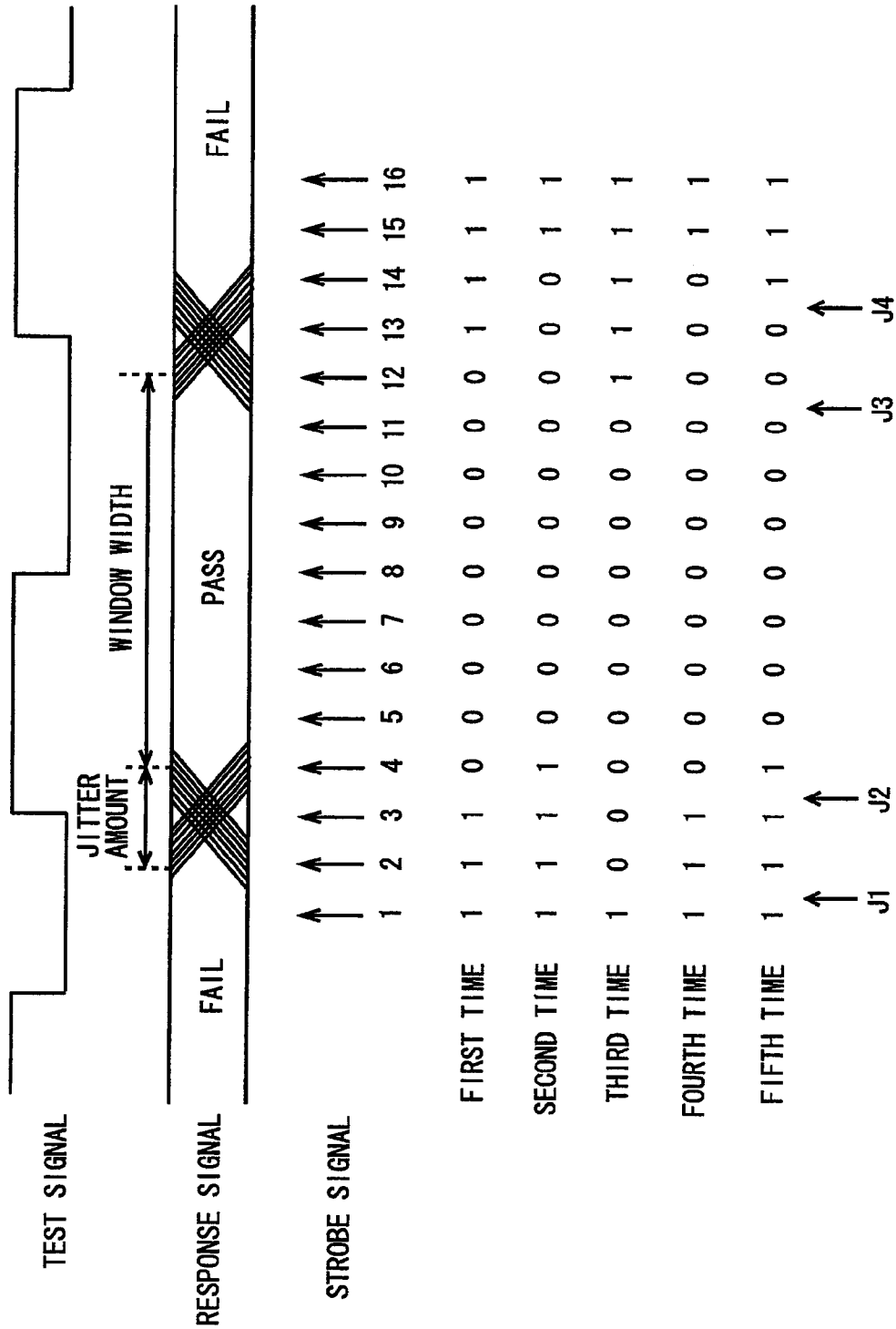
FIG. 12 shows an exemplary method for detecting the jitter amount.

FIG. 12 shows an exemplary method for detecting the jitter amount. The selected data 109 and each signal in FIG. 12 may be the same as those shown in FIG. 5. The cumulative jitter judging section 32 detects the leading edge and the trailing edge in the phase range of the multi-strobe signal 105 in which jitter occurs, based on the selected data 109 shown in FIG. 12.

In FIG. 12, the timing of a falling change point at which the value of the selected data 109 changes from 1 to 0 is the fourth phase, the fifth phase, the second phase, the fourth phase, and the fifth phase, respectively, in the first measurement to the fifth measurement. Therefore, the cumulative jitter judging section 32 detects that the value of the selected data 109 changes from 1 to 0 in a range between the second phase and the fourth phase. In other words, the leading edge phase of the jitter (J1 in FIG. 12) when the value of the selected data 109 changes from 1 to 0 is the second phase and the trailing edge phase of this jitter (J2 in FIG. 12) is the fourth phase. Therefore, the cumulative jitter judging section 32 detects the jitter amount to be 3Ts.

In the same way, the timing of a rising change point at which the value of the selected data 109 changes from 0 to 1 is the thirteenth phase, the fifteenth phase, the twelfth phase, the fifteenth phase, and the fourteenth phase, respectively, in the first measurement to the fifth measurement. Therefore, the cumulative jitter judging section 32 detects that the value of the selected data 109 changes from 0 to 1 in a range between the twelfth phase and the fifteenth phase. In other words, the leading edge phase of the jitter (J3 in FIG. 12) when the value of the selected data 109 changes from 0 to 1 is the twelfth phase and the trailing edge phase of this jitter (J4 in FIG. 12) is the fifteenth phase. Therefore, the cumulative jitter judging section 32 detects the jitter amount to be 3Ts.

FIG. 13 shows a method for judging that the device under test 200 is acceptable based on the jitter amount measurement result for each pin. For pin 1, the leading edge phase 31 and the trailing edge phase J2 of the jitter of the falling edge are the second phase and the fourth phase, respectively, and so the jitter amount is 3Ts. In the same way, the jitter amounts of the falling edges for pin 2 and pin 3 are both 4Ts. On the other hand, the jitter amount of the rising edge is 3Ts, 3Ts, and 5Ts, respectively, for pins 1 to 3.

In FIG. 13, the minimum value of the jitter amount reference value 122 is 1Ts and the maximum value is 4Ts. The edge selection signal 124 output to the cumulative jitter judging section 32 by the control section 70 indicates selection of a falling edge. Therefore, each cumulative jitter judging section 32 in the test function sections 20, 40, and 60 compares the jitter amount of the falling edge for the corresponding pin to the value indicated by the jitter amount reference value 122.

In FIG. 13, the jitter amount of the falling edge for pins 1 to 3 is within the range of the jitter amount reference value 122, and therefore each cumulative jitter judging section 32 judges the corresponding pin to be acceptable. The device jitter judging section 86 judges that the device under test 200 is acceptable based on the cumulative jitter judgment result 126 output by each cumulative jitter judging section 32 in the test function sections 20, 40, and 60.

FIG. 14 shows a method for judging that the device under test 200 is unacceptable based on the jitter amount measurement result for each pin. In FIG. 14, the jitter amount for each pin is the same as in FIG. 13. However, FIG. 14 differs from FIG. 13 in that the edge selection signal 124 indicates selection of a rising edge. Therefore, each cumulative jitter judging section 32 in the test function sections 20, 40, and 60 judges the acceptability of the corresponding pin based on the jitter amount of the rising edge.

At the rising edge, the jitter amount of the output data from pin 3 is 5Ts, which exceeds the maximum value for the reference jitter of 4Ts. Accordingly, the cumulative jitter judging section 32 in the test function section 60 corresponding to pin 3 judges that pin 3 is unacceptable. The device jitter judging section 86 may judge the device under test 200 to be unacceptable based on the cumulative jitter judgment result 126 output by the cumulative jitter judging section 32 in the test function section 60.

In the above description, the cumulative jitter judging section 32 judges the acceptability of each pin of the device under test 200 and then outputs the cumulative jitter judgment result 126 to the device jitter judging section 86, but the cumulative jitter judging section 32 may instead output the value of the detected data width to the device jitter judging section 86. In this case, the device jitter judging section 86 may judge the acceptability of the device under test 200 based on (i) the value of the jitter amount output by each cumulative jitter judging section 32 in the test function sections 20, 40, and 60 and (ii) the jitter amount reference value 122 output by the control section 70. The device jitter judging section 86 may output the judgment result 128 to the control section 70.

As described above, the test apparatus 100 can accurately detect the jitter amount of the response signal 102 by accumulating the selected data 109 in association with the phases of the strobe signals in each of the plurality of multi-strobe signals 105. The test apparatus 100 can judge the acceptability of the device under test 200 in a short time by testing the pins of the device under test 200 in parallel.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus and a test method for decreasing the amount of time necessary to test for jitter amount or data width.

What is claimed is:

1. A test apparatus for testing a device under test, comprising:
    a multi-strobe generating section that generates, for each prescribed test cycle, a multi-strobe that includes a plurality of strobes arranged at prescribed time intervals;
    a data detecting section that detects a logic value of a response signal output by the device under test, according to each strobe; and
    a period detecting section that detects a matching period during which the logic value of the response signal matches a prescribed expected value, based on each change point of a logic value output by the data detecting section, wherein
    when (i) a first change point at which the logic value of the response signal changes to the expected value and (ii) a second change point at which the logic value of the response signal changes from the expected value are detected with a single multi-strobe, the period detecting section detects the matching period based on positions of the first change point and the second change point, and
    when (i) a second change point at which the logic value of the response signal changes from the expected value is not detected after (ii) a first change point at which the logic value of the response signal changes to the expected value is detected, with a single multi-strobe, the multi-strobe generating section adjusts the position of the multi-strobe until a second change point at which the logic value of the response signal changes from the expected value is detected after the first change point at which the logic value of the response signal changes to the expected value is detected.

2. The test apparatus according to claim 1, wherein the multi-strobe generating section generates each multi-strobe such that the plurality of strobes in the multi-strobe are arranged over a period longer than a cycle of the response signal.

3. The test apparatus according to claim 1, wherein when (i) a second change point at which the logic value of the response signal changes from the expected value is detected after (ii) a first change point at which the logic value of the response signal changes to the expected value is detected, with a single multi-strobe, the period detecting section detects the matching period based on a phase difference between the first change point and the second change point.

4. The test apparatus according to claim 1, wherein the period detecting section includes:
    a sequential window judging section that, for each multi-strobe, outputs a sequential window judgment result indicating whether the detected matching period is within the prescribed allowable range; and
    a cumulative window judging section that outputs a cumulative window judgment result indicating whether a phase difference between (i) a first change point having a latest phase from among the first change points detected by a plurality of the multi-strobes and (ii) a second change point having an earliest phase from among the second change points detected by a plurality of multi-strobes is within an allowable range.

5. The test apparatus according to claim 1, wherein the test apparatus tests a plurality of pins of the device under test in parallel,
    one period detecting section is provided for each pin of the device under test, and
    the test apparatus further comprises a device window judging section that judges acceptability of the device under test based on a judgment result from each period detecting section.

6. The test apparatus according to claim 1, further comprising a jitter detecting section that detects jitter of the first change point or the second change point in each multi-strobe.

7. The test apparatus according to claim 6, wherein the jitter detecting section includes:
    a sequential jitter judging section that, for each multi-strobe, outputs a sequential jitter judgment result indicating whether the detected jitter is within an allowable range; and
    a cumulative jitter judging section that outputs a cumulative jitter judgment result indicating whether a phase difference between (i) a latest phase from among phases of the change points detected by a plurality of the multi-strobes and (ii) an earliest phase from among the phases of the change points detected by a plurality of the multi-strobes is within an allowable range.

8. The test apparatus according to claim 7, wherein
the test apparatus tests a plurality of pins of the device under test in parallel,
one jitter detecting section is provided for each pin of the device under test, and
the test apparatus further comprises a device jitter judging section that judges acceptability of the device under test based on a judgment result from each jitter detecting section.

9. The test apparatus according to claim 5, wherein
when (i) a first change point at which the logic value of the response signal changes from the expected value is detected after (ii) a second change point at which the logic value of the response signal changes to the expected value is detected, with a single multi-strobe, the multi-strobe generating section adjusts the position of the multi-strobe until the second change point at which the logic value of the response signal changes from the expected value is detected after another first change point at which the logic value of the response signal changes to the expected value is detected.

10. The test apparatus according to claim 1, wherein
when (i) a first change point at which the logic value of the response signal changes from the expected value is detected after (ii) a second change point at which the logic value of the response signal changes to the expected value is detected, with a single multi-strobe, the multi-strobe generating section adjusts the position of the multi-strobe until another second change point at which the logic value of the response signal changes from the expected value is detected after the first change point at which the logic value of the response signal changes to the expected value is detected.

11. A test apparatus for testing a device under test, comprising:
a multi-strobe generating section that generates, for each prescribed test cycle, a multi-strobe that includes a plurality of strobes arranged at prescribed time intervals;
a data detecting section that detects a logic value of a response signal output by the device under test, according to each strobe; and
a period detecting section that detects a matching period during which the logic value of the response signal matches a prescribed expected value, based on each change point of a logic value output by the data detecting section, wherein
when (i) a first change point at which the logic value of the response signal changes to the expected value and (ii) a second change point at which the logic value of the response signal changes from the expected value are detected with a single multi-strobe, the period detecting section detects the matching period based on positions of the first change point and the second change point, and
when (i) a first change point at which the logic value of the response signal changes to the expected value is not detected before (ii) a second change point at which the logic value of the response signal changes from the expected value is detected, with a single multi-strobe, the period detecting section detects the matching period based on a period from a start point of the multi-strobe to the second change point.

12. The test apparatus according to claim 11, wherein
when (i) a second change point at which the logic value of the response signal changes from the expected value is not detected after (ii) a first change point at which the logic value of the response signal changes to the expected value is detected, with a single multi-strobe, the period detecting section detects the matching period based on a period from the first change point to an end point of the multi-strobe.

13. The test apparatus according to claim 12, wherein
when (i) a second change point at which the logic value of the response signal changes from the expected value is not detected after (ii) a first change point at which the logic value of the response signal changes to the expected value is detected, with a single multi-strobe, the multi-strobe generating section delays the phase of the multi-strobe, on a condition that the matching period detected by the period detecting section is outside of a prescribed allowable range.

14. The test apparatus according to claim 11, wherein
when (i) a first change point at which the logic value of the response signal changes to the expected value is not detected before (ii) a second change point at which the logic value of the response signal changes from the expected value is detected, with a single multi-strobe, the multi-strobe generating section causes the phase of the multi-strobe to be earlier, on a condition that the matching period detected by the period detecting section is outside of a prescribed allowable range.

15. A method for testing a device under test, comprising:
generating, for each prescribed test cycle, a multi-strobe that includes a plurality of strobes arranged at prescribed time intervals;
detecting a logic value of a response signal output by the device under test, according to each strobe; and
detecting a matching period indicating a period during which the logic value of the response signal matches a prescribed expected value, based on each change point of the detected logic value, wherein
when (i) a first change point at which the logic value of the response signal changes to the expected value and (ii) a second change point at which the logic value of the response signal changes from the expected value are detected with a single multi-strobe, the matching period is detected based on positions of the first change point and the second change point, and
when (i) a second change point at which the logic value of the response signal changes from the expected value is not detected after (ii) a first change point at which the logic value of the response signal changes to the expected value is detected, with a single multi-strobe, the position of the multi-strobe is adjusted until a second change point at which the logic value of the response signal changes from the expected value is detected after the first chancre point at which the logic value of the response signal changes to the expected value is detected.

16. The method according to claim 15, wherein
when (i) a first change point at which the logic value of the response signal changes to the expected value is not detected before (ii) a second change point at which the logic value of the response signal changes from the expected value is detected, with a single multi-strobe, the position of the multi-strobe is adjusted until the second change point at which the logic value of the response signal changes from the expected value is detected after a first change point at which the logic value of the response signal changes to the expected value is detected.

17. The method according to claim 15, wherein
when (i) a first change point at which the logic value of the response signal changes from the expected value is detected after (ii) a second change point at which the logic value of the response signal changes to the expected value is detected, with a single multi-strobe, the position of the multi-strobe is adjusted until the second change point at which the logic value of the response signal changes from the expected value is detected after another first change point at which the logic value of the response signal changes to the expected value is detected.

18. The method according to claim 15, wherein when (i) a first change point at which the logic value of the response signal changes from the expected value is detected after (ii) a second change point at which the logic value of the response signal changes to the expected value is detected, with a single multi-strobe, the position of the multi-strobe is adjusted until another second change point at which the logic value of the response signal changes from the expected value is detected after the first change point at which the logic value of the response signal changes to the expected value is detected.

19. A method for testing a device under test, comprising:
generating, for each prescribed test cycle, a multi-strobe that includes a plurality of strobes arranged at prescribed time intervals;
detecting a logic value of a response signal output by the device under test, according to each strobe; and
detecting a matching period indicating a period during which the logic value of the response signal matches a prescribed expected value, based on each change point of the detected logic value, wherein when (i) a first change point at which the logic value of the response signal changes to the expected value and (ii) a second change point at which the logic value of the response signal changes from the expected value are detected with a single multi-strobe, the matching period is detected based on positions of the first change point and the second change point, and when (i) a first change point at which the logic value of the response signal changes to the expected value is not detected before (ii) a second change point at which the logic value of the response signal changes from the expected value is detected, with a single multi-strobe, the matching period is detected based on a period from a start point of the multi-strobe to the second change point.

20. The test apparatus according to claim 1, wherein when (i) a first change point at which the logic value of the response signal changes to the expected value is not detected before (ii) a second change point at which the logic value of the response signal changes from the expected value is detected, with a single multi-strobe, the multi-strobe generating section adjusts the position of the multi-strobe until the second change point at which the logic value of the response signal changes from the expected value is detected after a first change point at which the logic value of the response signal changes to the expected value is detected.

* * * * *